United States Patent
Godambe et al.

(10) Patent No.: US 6,812,802 B1
(45) Date of Patent: Nov. 2, 2004

(54) METHOD AND APPARATUS FOR CONTROLLING A VOLTAGE CONTROLLED OSCILLATOR

(75) Inventors: Nihal Godambe, Plantation, FL (US); Walt Kehler, Sunrise, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 45 days.

(21) Appl. No.: 10/420,664

(22) Filed: Apr. 22, 2003

(51) Int. Cl.[7] .............................. H03B 5/06; H03B 5/08; H03B 5/12
(52) U.S. Cl. ................. 331/183; 331/109; 331/117 FE; 331/173
(58) Field of Search .............................. 331/36 C, 109, 331/117 R, 117 FE, 117 D, 173, 182, 183

(56) References Cited

U.S. PATENT DOCUMENTS

| | | | | |
|---|---|---|---|---|
| 3,815,048 A | * | 6/1974 | Hamlet ........................ | 331/109 |
| 4,968,952 A | | 11/1990 | Kehler, Jr. .................... | 331/11 |
| 5,663,690 A | * | 9/1997 | McGinn ....................... | 331/109 |
| 6,025,757 A | * | 2/2000 | Tsukagoshi et al. ......... | 331/158 |
| 6,064,277 A | | 5/2000 | Gilbert ........................ | 331/117 |
| 6,137,375 A | * | 10/2000 | Li .............................. | 331/175 |
| 6,680,655 B2 | * | 1/2004 | Rogers ........................ | 331/109 |

OTHER PUBLICATIONS

Mihai A. Margarit, Joo Leong (Julian) Tham, Robert G. Meyer, and M. Jamal Deen, "A Low–Noise, Low–Power VCO with Automatic Amplitude Control for Wireless Application", IEEE Journal of Solid–State Circuits, vol. 34 No. 6, Jun. 1999; pp. 761–771.

* cited by examiner

*Primary Examiner*—David Mis
(74) *Attorney, Agent, or Firm*—Posz & Bethards, PLC; Charles W. Bethards

(57) ABSTRACT

A rectifier (306) rectifies (402) an output signal of a VCO (302) to produce an envelope signal proportional to an amplitude of the output signal. An integrator (308) integrates (404) the envelope signal to produce a comparison signal, such that, in response to a change in the envelope signal, during a first mode of operation of the VCO, the comparison signal is allowed to change at a first rate, and, during a second mode of operation of the VCO, the comparison signal is allowed to change at a second rate different from the first rate. A comparator (310) compares (406) the comparison signal with a reference signal (316) to produce a bias signal, and controls (408) a gain of the VCO with the bias signal.

24 Claims, 3 Drawing Sheets

US 6,812,802 B1

METHOD AND APPARATUS FOR CONTROLLING A VOLTAGE CONTROLLED OSCILLATOR

FIELD OF THE INVENTION

This invention relates in general to wireless communication systems and equipment, and more specifically to a method and apparatus for controlling a voltage controlled oscillator for use therein.

BACKGROUND OF THE INVENTION

It is desirable for a voltage controlled oscillator (VCO) used in a portable communication device to meet various conflicting requirements. Such requirements include, for example, low phase noise in order to satisfy sideband noise requirements, and fast start-up of the VCO when leaving a battery-saving mode as well as when switching to a different frequency band, in order to avoid delaying the start of a communication. In prior-art VCOs operating in open loop, guaranteeing startup has implied using a high gain in the VCO amplifier. This high gain in the VCO amplifier in turn has produced a large output swing. Although a large output swing may satisfy the phase noise specifications, it results in wasted power, which is unacceptable for portable communications equipment. A low-gain in the VCO amplifier implies better spectral purity (and fewer harmonics) since the VCO amplifier does not saturate or "clip" the output signal. However, with low gain, start-up may not be guaranteed. Thus, a trade-off or compromise has had to be made between the start-up requirement and the phase noise (or output amplitude). Some prior-art VCOs have used a "medium" gain, e.g., a small-signal total loop gain of two or three, as a compromise. Unfortunately, the compromise has not produced very satisfactory results in terms of either start-up speed or phase noise.

Thus, what is needed is a method and apparatus for controlling a VCO that decouples the relationship between guaranteed start-up and phase noise, and achieves reduced phase noise and a fast start-up, independently. The method and apparatus preferably will lend itself to fabrication as a low-power CMOS integrated circuit.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF THE PREFERRED EMBODIMENTS

In overview, the present disclosure concerns communications systems that utilize transceivers to provide service for communications units or more specifically a user thereof operating therein. More particularly, various inventive concepts and principles embodied as a method and apparatus for controlling a voltage controlled oscillator for use in equipment with such communications systems will be discussed and disclosed. The communications systems of particular interest are those being deployed and developed such as the Global System for Mobile Communications (GSM), Wideband Code Division Multiple Access, (W-CDMA), Third-Generation, (3G) systems, such as Universal Mobile Telecommunications Services (UMTS) systems, and evolutions thereof, although the concepts and principles have application in other systems and devices, as well.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in one or more conventional digital signal processors (DSPs), or with integrated circuits (ICs) such as custom or application specific CMOS ICs. It is expected that one of ordinary skill, notwithstanding possibly significant effort and many design choices motivated by, for example, available time, current technology, and economic considerations, when guided by the teachings, concepts and principles disclosed herein will be readily capable of programming such DSPs, or generating such ICs with minimal experimentation. Therefore, in the interest of brevity and minimization of any risk of obscuring the principles and concepts according to the present invention, further discussion of such DSPs and ICs, if any, will be limited to the essentials with respect to the principles and concepts employed by the preferred embodiments.

Figure 1:
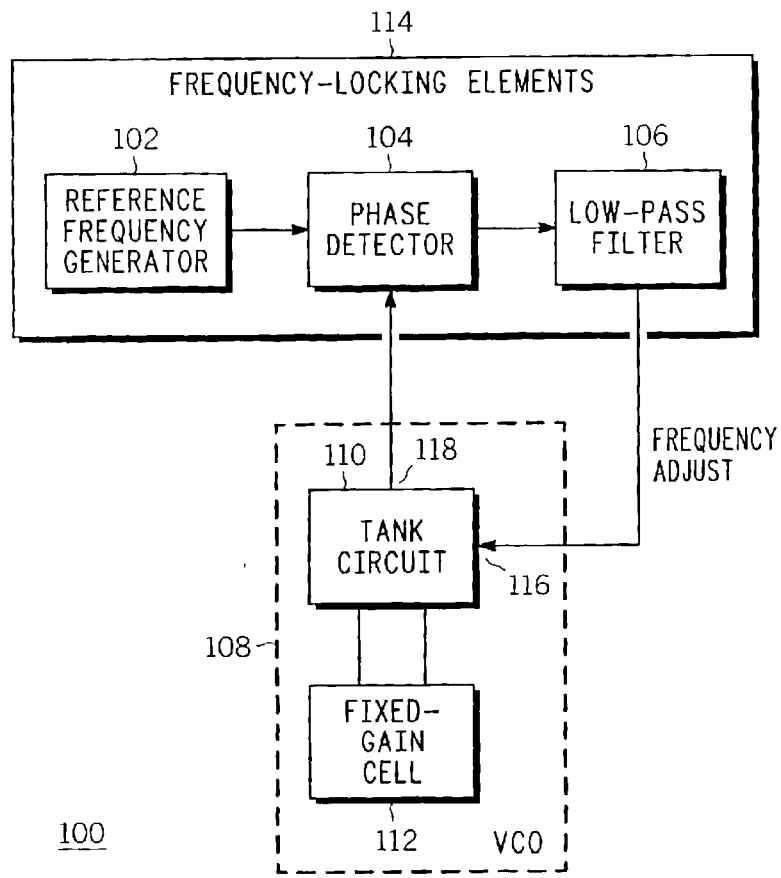
FIG. 1 is an electrical block diagram of a prior-art voltage controlled oscillator and frequency-locking elements.

Referring to FIG. 1, an electrical block diagram 100 of a prior-art voltage controlled oscillator (VCO) 108 and frequency-locking elements 114 is depicted. The VCO 108 comprises a tank circuit 110 coupled to a fixed gain cell 112. The tank circuit 110 comprises a frequency adjust input 116 for adjusting the frequency of the VCO 108. The frequency-locking elements 114 comprise a reference frequency generator 102 coupled to a phase detector 104. The phase detector 104 is also coupled to an output 118 of the VCO 108 for comparing the phase of the VCO 108 with that of the reference frequency generator 102 to generate an error signal. The frequency-locking elements 114 further comprise a low-pass filter 106 coupled to the phase detector 104 for filtering the error signal. The low-pass filter 106 is coupled to the frequency adjust input 116 for adjusting the VCO frequency in accordance with the filtered error signal. In operation, the VCO has a gain setting that causes the output amplitude to grow until the VCO self-limits when the output amplitude reaches a clipping point of the VCO. However this is not the optimum gain setting for the VCO amplifier to achieve minimum phase noise.

Figure 2:
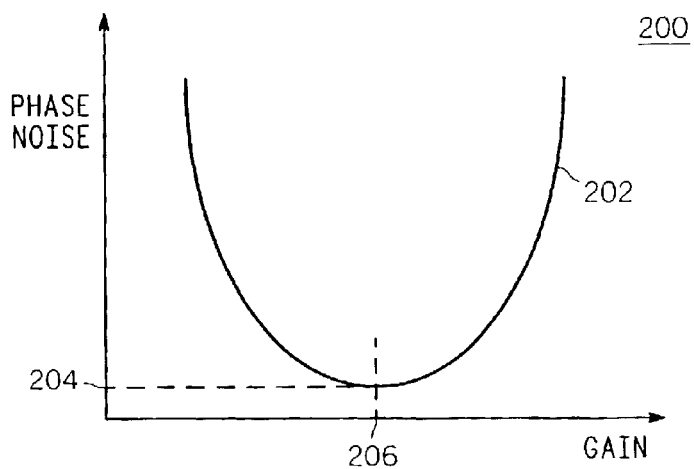
FIG. 2 is a graph depicting phase noise versus gain of a voltage controlled oscillator.

FIG. 2 is a graph 200 including a curve 202 depicting phase noise versus gain of a voltage controlled oscillator.

The curve indicates that as the gain of the VCO increases from zero, the phase noise decreases to a minimum 204 at an optimum gain 206 and then increases with a larger gain. Thus, for minimum phase noise, it is desirable to operate the VCO at the optimum gain 206. Unfortunately, fixing the gain at the optimum gain 206 will result in a slower-than-desired start-up speed (since a larger gain is required for a faster start-up). Thus, an additional technique is provided in accordance with the present invention to correct the start-up speed, as discussed herein below.

Figure 3:
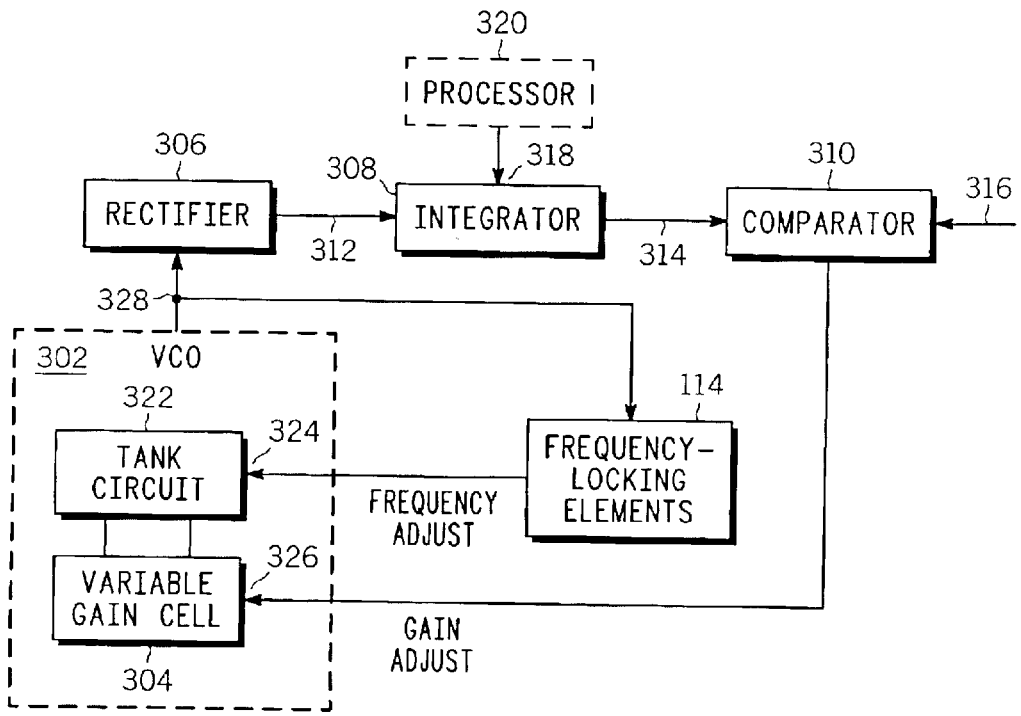
FIG. 3 is an electrical block diagram of an exemplary amplitude-regulated voltage controlled oscillator.

FIG. 3 is an electrical block diagram of an exemplary amplitude-regulated voltage controlled oscillator (ARVCO) 300. The ARVCO 300 comprises a VCO 302 preferably including an adjustable tank circuit 322, e.g., an inductor coupled to a varactor, and a variable gain cell 304, e.g., a conventional negative transconductance cell having an adjustable bias current for controlling the gain through a gain adjust input 326. The VCO output 328 is coupled to conventional frequency locking elements 114 for locking the frequency, and the frequency locking elements 114 are coupled to a frequency adjust input 324 of the VCO 302.

In addition, the VCO output 328 is coupled to a rectifier 306 for rectifying the output signal of the VCO 302 to produce an envelope signal proportional to an amplitude of the output signal at a rectifier output 312. The rectifier output 312 is coupled to an integrator 308 for integrating the envelope signal to produce a comparison signal at an integrator output 314. The integrator 308 includes a speed-up input 318 for receiving a control signal, preferably from a processor 320 that controls the wireless device in which the ARVCO 300 is used. The integrator 308 and the processor 320 cooperate such that, in response to a change in the envelope signal, during a first mode of operation, such as a start-up of the VCO 302, the comparison signal is allowed to change at a first rate, and, after the first mode or first operating mode or start-up has completed, eg during a second mode of operation, the comparison signal is allowed to change at a second rate different from the first rate. More specifically, the first rate is set to facilitate the start-up of the VCO 302. Preferably, the integrator 308 comprises a conventional resistor-capacitor filter and a conventional switch arranged to remove the capacitor temporarily from the circuit (leaving only the parasitic capacitance at the node from which the capacitor is removed) when the control signal from the processor 320 indicates that the VCO is starting up or making a large change in frequency. The removal of the capacitor allows the comparison signal to change rapidly (e.g., an integrator time constant of 1.0 ns) to increase the gain of the VCO 302 during start-up. The second rate is preferably set through well-known techniques to be substantially lower (e.g., an integrator time constant of 12 ns) than the first rate to permit the VCO 302 to settle with low ripple in the comparison signal at the integrator output 314, into an optimum gain for reducing the phase noise. It will be appreciated that, alternatively, many other techniques, such as relative impedance or resistance changes impacting circuit time constants, can be utilized to temporarily quicken the response speed of the integrator 308 when needed in accordance with the present invention.

The ARVCO 300 further comprises a comparator 310 coupled to the integrator output 314 for comparing the comparison signal with a reference signal 316, e.g., a reference voltage, to produce a bias signal, which is applied at the gain adjust input 326 of the variable gain cell 304 of the VCO 302 for controlling the gain of the VCO 302. Preferably, the reference voltage and other gain constants of the ARVCO 300 are adjusted and arranged such that when the VCO 302 reaches a steady-state operation, the VCO 302 operates near or within +/_30% of the optimum gain 206 for reducing the phase noise. It will be appreciated that, in one embodiment, all or a portion of the ARVCO 300 can be fabricated as a complementary metal oxide semiconductor (CMOS) integrated circuit in accordance with known high frequency processes. Advantageously, simulations and actual measurements have demonstrated that the CMOS integrated circuit embodiment of the ARVCO 300 can be scaled to operate at a frequency of four GHz, and from a supply voltage as low as 1.5 volts, as required for some wireless applications.

Figure 4:
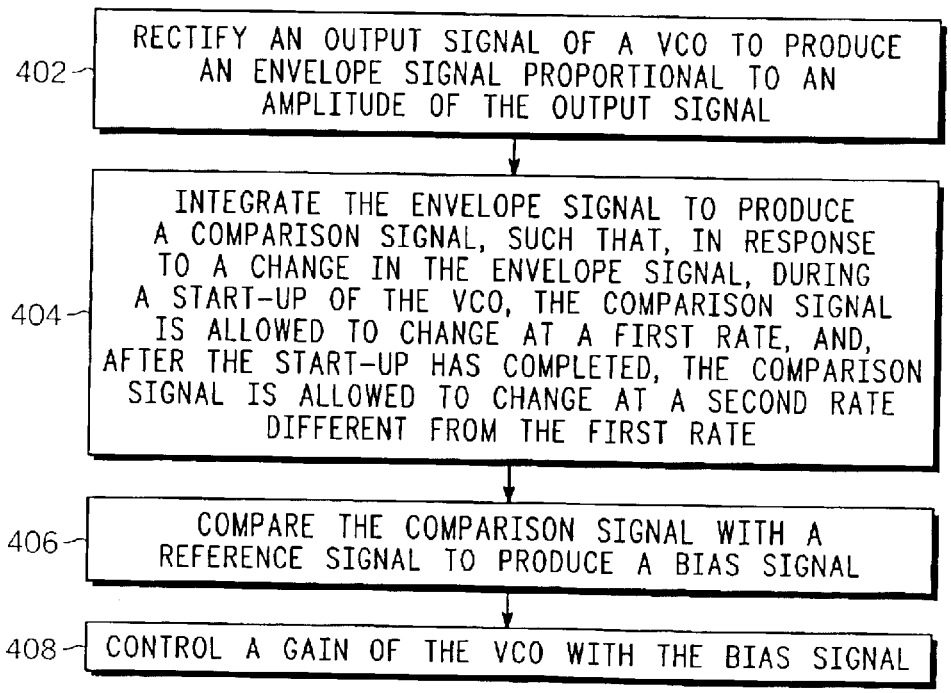
FIG. 4 is a flow diagram depicting operation of the amplitude-regulated voltage controlled oscillator.

FIG. 4 is a flow diagram 400 depicting operation of the ARVCO 300. The flow begins when the rectifier 306 rectifies 402 the output signal of the VCO 302 to produce an envelope signal proportional to an amplitude of the output signal. The integrator 308 then integrates 404 the envelope signal to produce a comparison signal, such that, in response to a change in the envelope signal, during a first operating mode, such as a start-up of the VCO 302, the comparison signal is allowed to change at a first rate, and, after the first mode or start-up has completed and during a second mode of operation, such as steady state operation, the comparison signal is allowed to change at a second rate different from the first rate. The comparator 310 then compares 406 the comparison signal with the reference signal 316 to produce a bias signal, which controls 408 the gain of the VCO 302. The first rate is set to facilitate the start-up of the VCO 302. The second rate is set substantially lower than the first rate to permit the VCO to settle with low ripple into a gain approaching the optimum gain 206 for reducing the phase noise of the VCO 302. The gain parameters of the VCO 302 are set such that when the VCO reaches a steady-state operation, the VCO operates near the gain that approaches the optimum gain 206 for reducing the phase noise.

Figure 5:
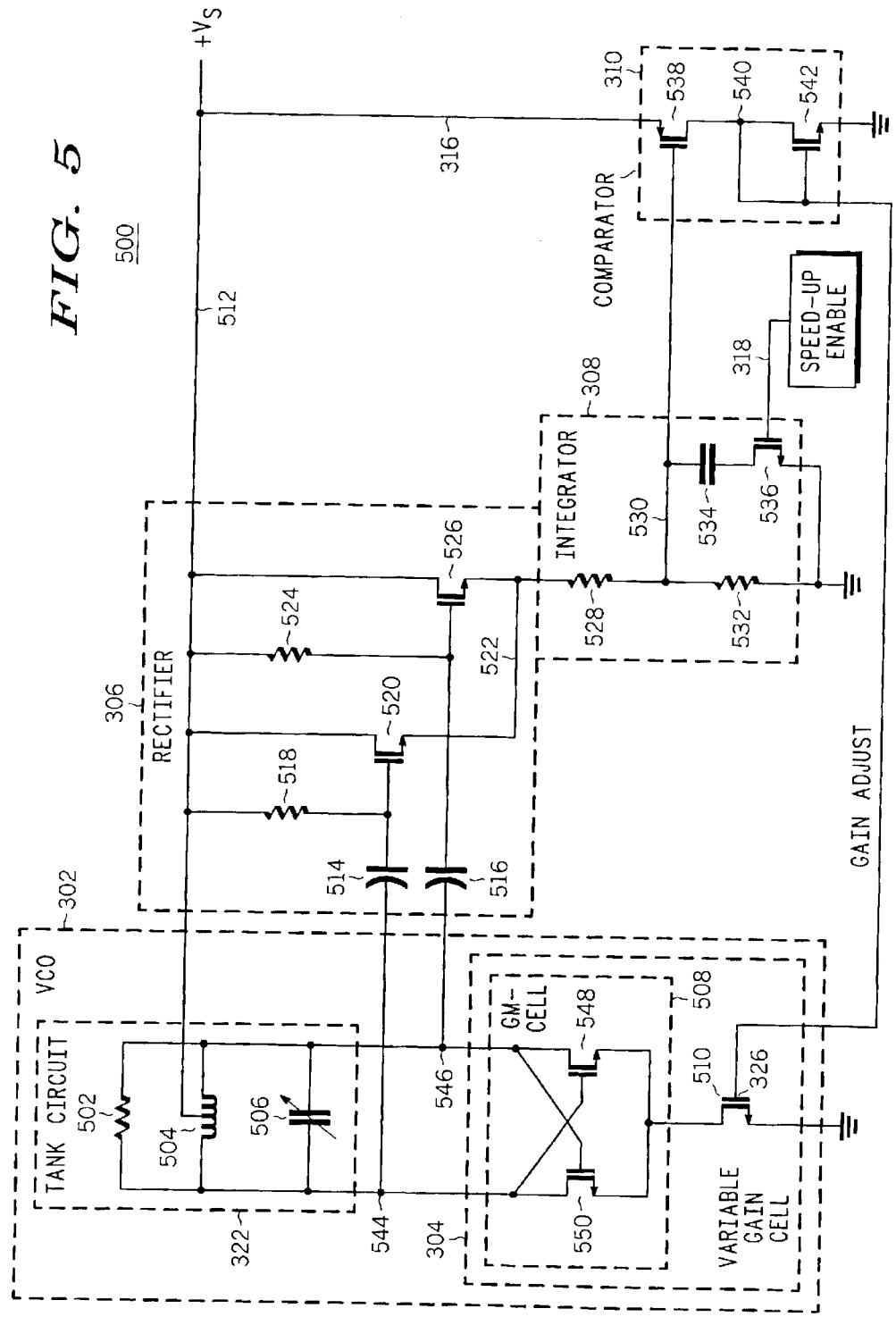
FIG. 5 is an exemplary schematic diagram of the amplitude-regulated voltage controlled oscillator.

FIG. 5 is an exemplary schematic diagram 500 of the ARVCO 300. The diagram 500 shows that a simplified version (the frequency-locking elements 114 have been omitted) of the tank circuit 322 comprises an inductor 504 and a variable capacitor 506 (varactor) coupled in parallel between first and second nodes 544, 546. A first resistor 502, representing the inherent resistance of the inductor 504 is also shown coupled between the first and second nodes 544, 546. In one embodiment the inductor 504 is a two turn center tapped octagonal inductor where the center tap of the inductor 504 is coupled to a supply voltage node 512. The variable gain cell 304 comprises a conventional negative transconductance cell 508, including first and second cross-coupled NMOS transistors 550, 548 having their drains coupled, respectively, to the first and second nodes 544, 546. In this embodiment the output signal (328 in FIG. 3) of the VCO is a differential output signal taken across the nodes 544, 546. If a single ended output signal is required either of the nodes may be utilized to provide an output signal. The gate of the first transistor 550 is coupled to the second node 546, and the gate of the second transistor 548 is coupled to the first node 544. The sources of the first and second transistors 550 and 548 are coupled to the drain of a third NMOS transistor 510, whose source is coupled to circuit ground and whose gate is the gain adjust input 326 of the VCO 302.

The rectifier 306 comprises a first capacitor 514 coupled between the first node 544 and the gate of a fourth NMOS transistor 520. A second resistor 518 is coupled between the gate of the fourth transistor 520 and the supply voltage node 512. The drain of the fourth transistor 520 is also coupled to the supply voltage node 512. The source of the fourth transistor 520 is coupled to a third node 522. A second capacitor 516 is coupled between the second node 546 and the gate of a fifth NMOS transistor 526. A third resistor 524 is coupled between the supply voltage node 512 and the gate of the fifth transistor 526. The drain of the fifth transistor 526 is coupled to the supply voltage node 512, and the source of the fifth transistor 526 is coupled to the third node 522.

The integrator 308 comprises a fourth resistor 528 coupled between the third node 522 and a fourth node 530. A fifth resistor 532 is coupled between the fourth node 530 and circuit ground. A third capacitor 534 is coupled between the fourth node 530 and the drain of a sixth NMOS transistor 536, whose source is coupled to circuit ground. The gate of the sixth transistor 536 is the speed-up input 318 of the integrator 308.

The comparator 310 comprises a seventh transistor 538, this one of PMOS type. The source of the seventh transistor 538 is coupled to the supply voltage node 512, which serves as the reference signal 316. The gate of the seventh transistor 538 is coupled to the fourth node 530, and its drain is coupled to a fifth node 540. The drain of an eighth transistor 542 of NMOS type is also coupled to the fifth node 540. The gate of the eighth transistor 542 is coupled to fifth node 540, as well, and is further coupled to the gain adjust input 326 of the variable-gain cell 304. The source of the eighth transistor 542 is coupled to circuit ground. The supply voltage node 512 is preferably coupled to a positive supply voltage. It will be appreciated by one of ordinary skill in the art that, alternatively, the NMOS and PMOS types of transistors can each be switched to the opposite type and the supply voltage node 512 coupled to a negative supply voltage to build a complementary parallel of the circuit depicted in the diagram 500.

The simple design and low component count of the ARVCO 300 as depicted in the diagram 500 advantageously permits the ARVCO 300 to be fabricated in its entirety as a CMOS integrated circuit capable of operation at four GHz from a supply voltage as low as 1.25 volts, thereby making it ideal for today's high speed portable wireless communication devices.

Thus, it should be clear from the preceding disclosure that the present invention provides a method and apparatus for controlling a VCO that decouples the relationship between guaranteed start-up and phase noise, and achieves reduced phase noise and a fast start-up, independently. The method and apparatus advantageously consumes little power and can operate at frequencies heretofore unattainable in a VCO using CMOS technology.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method for controlling a voltage controlled oscillator (VCO), the method comprising:
   rectifying an output signal of the VCO to produce an envelope signal proportional to an amplitude of the output signal;
   integrating the envelope signal to produce a comparison signal, such that, in response to a change in the envelope signal, during a first mode of operation of the VCO, the comparison signal is allowed to change at a first rate, and, during a second mode of operation, the comparison signal is allowed to change at a second rate different from the first rate;
   comparing the comparison signal with a reference signal to produce a bias signal; and
   controlling a gain of the VCO with the bias signal.

2. The method of claim 1, wherein the first mode of operation is a start-up of the VCO and the method further comprises setting the first rate to facilitate the start-up of the VCO.

3. The method of claim 1, wherein controlling the gain of the VCO comprises adjusting the gain such that when the VCO reaches a steady-state operation, the VCO operates near an optimum gain for reducing phase noise of the VCO.

4. The method of claim 1, further comprising
   setting the second rate substantially lower than the first rate to permit the VCO to settle into a gain for improving a phase noise of the VCO.

5. An apparatus for controlling a voltage controlled oscillator (VCO), the apparatus comprising:
   a rectifier for rectifying an output signal of the VCO to produce an envelope signal proportional to an amplitude of the output signal;
   an integrator coupled to the rectifier for integrating the envelope signal to produce a comparison signal, the integrator further coupled to a control signal and arranged such that, in response to a change in the envelope signal, when the control signal indicates that the VCO is to operate in a first mode of operation, the comparison signal is allowed to change at a first rate, and, when the control signal indicates that the VCO is to operate in a second mode, the comparison signal is allowed to change at a second rate different from the first rate; and
   a comparator, coupled to the integrator and coupled to a reference signal, for comparing the comparison signal with the reference signal to produce a bias signal, wherein the bias signal is for controlling a gain of the VCO.

6. The apparatus of claim 5, wherein the integrator is further arranged such that the first rate and the second rate, respectively, facilitate the first mode of operation and the second mode of operation, the first mode of operation further comprising a start-up of the VCO and the second mode of operation comprising steady-state operation of the VCO.

7. The apparatus of claim 5, further arranged such that when the VCO reaches a steady-state operation, the VCO operates near an optimum gain for reducing phase noise.

8. The apparatus of claim 5, wherein the integrator is further arranged such that the second rate is substantially lower than the first rate to permit the VCO to settle into a gain for reducing phase noise.

9. The apparatus of claim 5, wherein the rectifier, the integrator, and the comparator are fabricated as a complementary metal oxide semiconductor (CMOS) integrated circuit.

10. A wireless communications unit utilizing the apparatus of claim 5 to control a VCO and establish a frequency reference for the wireless communications unit.

11. An amplitude-regulated voltage controlled oscillator (ARVCO) comprising:
   a voltage controlled oscillator (VCO), including a tank circuit for setting an operating frequency of the VCO, and a variable-gain cell coupled to the tank circuit for providing a gain for sustaining an oscillation;
   a rectifier coupled to the VCO for rectifying an output signal of the VCO to produce an envelope signal proportional to an amplitude of the output signal;
   an integrator coupled to the rectifier for integrating the envelope signal to produce a comparison signal, and responsive to a control signal, the integrator arranged such that, in response to a change in the envelope signal, when the control signal indicates that the VCO is to operate in a first mode of operation, the comparison signal is allowed to change at a first rate, and, when the control signal indicates that the VCO is to operate in a second mode of operation, the comparison signal is allowed to change at a second rate different from the first rate; and
   a comparator, coupled to the integrator and coupled to a reference signal, for comparing the comparison signal with the reference signal to produce a bias signal, wherein the bias signal is coupled to the variable-gain cell of the VCO for controlling the gain of the VCO.

12. The ARVCO of claim 11, wherein the integrator is further arranged such that the first rate facilitates the first mode of operation, where in the first mode further comprises a start-up of the VCO.

13. The ARVCO of claim 11, further arranged such that when the VCO reaches a steady-state operation, the VCO operates near an optimum gain for minimizing phase noise.

14. The ARVCO of claim 11, wherein the integrator is further arranged such that the second rate is substantially lower than the first rate to permit the VCO to settle into a gain for improving phase noise of the VCO.

15. The ARVCO of claim 11, wherein the VCO, the rectifier, the integrator, and the comparator are fabricated as a complementary metal oxide semiconductor (CMOS) integrated circuit.

16. A wireless communications unit utilizing the ARVCO of claim 11 to establish a frequency reference for the wireless communications unit.

17. A complementary metal oxide semiconductor (CMOS) integrated circuit comprising:
   a voltage controlled oscillator (VCO), including a tank circuit for setting an operating frequency of the VCO, and a variable-gain cell coupled to the tank circuit for providing a gain for sustaining an oscillation;
   a rectifier coupled to the VCO for rectifying an output signal of the VCO to produce an envelope signal proportional to an amplitude of the output signal;
   an integrator coupled to the rectifier for integrating the envelope signal to produce a comparison signal, and responsive to a control signal, the integrator arranged such that, in response to a change in the envelope signal, when the control signal indicates that the VCO is to operate in a first mode, the comparison signal is allowed to change at a first rate, and, when the control signal indicates that the VCO is to operate in a second mode, the comparison signal is allowed to change at a second rate different from the first rate; and
   a comparator, coupled to the integrator and coupled to a reference signal, for comparing the comparison signal with the reference signal to produce a bias signal, wherein the bias signal is coupled to the variable-gain cell of the VCO for controlling the gain of the VCO.

18. The CMOS integrated circuit of claim 17, wherein the integrator is further arranged such that the first rate facilitates the first mode of operation, the first mode of operation comprising a start-up of the VCO.

19. The CMOS integrated circuit claim 17, wherein the second mode of operation of the VCO is a steady-state operation and wherein the integrated circuit is further arranged such that when the VCO is in the steady-state operation, the VCO operates near a gain for minimizing phase noise of the VCO.

20. The CMOS integrated circuit of claim 17, wherein the integrator is further arranged such that the second rate is substantially lower than the first rate to permit the VCO to settle into a gain for improving a phase noise of the VCO.

21. The CMOS integrated circuit of claim 17 arranged and scaled such that the operating frequency is approximately four GHz.

22. The CMOS integrated circuit of claim 17, arranged to operate from a supply voltage as low as 1.25 volts.

23. A wireless communications unit utilizing the CMOS integrated circuit of claim 17 to establish a frequency reference for the wireless communications unit.

24. The wireless communications unit of claim 23 wherein the CMOS integrated circuit of claim 17 is to operate in the first mode of operation comprising a start-up mode and in the second mode of operation comprising a steady-state mode of operation having lower phase noise than in the start-up mode.

* * * * *

UNITED STATES PATENT AND TRADEMARK OFFICE
CERTIFICATE OF CORRECTION

PATENT NO. : 6,812,802 B1
DATED : November 2, 2004
INVENTOR(S) : Godambe et al.

It is certified that error appears in the above-identified patent and that said Letters Patent is hereby corrected as shown below:

<u>Column 8,</u>
Line 45, please delete "17" and insert -- 15 --.

Signed and Sealed this

Tenth Day of May, 2005

JON W. DUDAS
*Director of the United States Patent and Trademark Office*